United States Patent
Kaufman et al.

(10) Patent No.: US 6,847,199 B2
(45) Date of Patent: Jan. 25, 2005

(54) CAPTURING BOTH DIGITAL AND ANALOG FORMS OF A SIGNAL THROUGH THE SAME PROBING PATH

(75) Inventors: A. Roy Kaufman, Beaverton, OR (US); Roland E. Andrews, Sequim, WA (US); Colin L. Shepard, Hillsboro, OR (US); William R. Mark, Hillsboro, OR (US); Lester L. Larson, Portland, OR (US); Donald F. Murray, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 10/365,202

(22) Filed: Feb. 11, 2003

(65) Prior Publication Data

US 2003/0160625 A1 Aug. 28, 2003

Related U.S. Application Data

(60) Provisional application No. 60/356,453, filed on Feb. 11, 2002.

(51) Int. Cl.$^7$ ............................................. G01R 13/20
(52) U.S. Cl. ................ 324/73.1; 324/158.1; 324/121 R
(58) Field of Search ......................... 324/121 R, 158.1, 324/115; 345/780, 734; 315/383, 169; 702/66, 67

(56) References Cited

U.S. PATENT DOCUMENTS

| 4,507,618 A | 3/1985 | Nelson | |
| 4,642,519 A | * 2/1987 | Nakatsugawa et al. | 315/1 |
| 5,225,776 A | * 7/1993 | Dobos et al. | 324/121 R |
| 5,235,270 A | * 8/1993 | Shimada et al. | 324/121 R |

FOREIGN PATENT DOCUMENTS

| JP | 03162677 | 7/1991 |
| JP | 11051974 | 2/1999 |

* cited by examiner

*Primary Examiner*—Michael Tokar
*Assistant Examiner*—Tung X. Nguyen
(74) *Attorney, Agent, or Firm*—Thomas F. Lenihan; Francis I. Gray

(57) ABSTRACT

An instrument includes a probe providing a single signal path for conveying a signal from a circuit under test to the instrument. A receiver circuit within the instrument divides the path into an analog path and a digital path. The digital path includes a comparator for determining the logic state of the signal and producing a digital representation of the signal under test. The analog path includes a multiplexer to selectively couple one of a plurality of analog input signals to an output terminal for viewing on an oscilloscope. Preferably, the probe head includes a buffer amplifier to reduce loading on the circuit under test and to increase bandwidth of the signals conveyed along the test cable to the instrument. An electrically trimmable resistor is employed to terminate the transmission line of the test cable in its characteristic impedance in order to reduce reflections and maintain transmission bandwidth.

13 Claims, 4 Drawing Sheets

CAPTURING BOTH DIGITAL AND ANALOG FORMS OF A SIGNAL THROUGH THE SAME PROBING PATH

CROSS REFERENCE TO RELATED APPLICATIONS

This application claims benefit of U.S. Provisional Patent Application No. 60/356,453 filed Feb. 11, 2002, and is incorporated herein by reference in its entirety.

FIELD OF THE INVENTION

The subject invention concerns signal acquisition in test and measurement equipment, in general, and concerns acquisition of both analog and digital signals in test equipment such as a logic analyzer.

BACKGROUND OF THE INVENTION

Heretofore, test and measurement equipment, such as logic analyzers, have employed probes having one of two kinds of probe heads. The first kind of probe head includes a simple attenuator for conveying a reduced amplitude signal from a circuit under test to the test instrument. This reduced amplitude signal is converted to digital form by a comparator in the logic analyzer. To reduce loading on the circuit under test, the second kind of probe head includes a relatively high input impedance comparator for determining the instantaneous binary state of the signal under test, and conveying a digital representation of test signal up the cable to the instrument.

Unfortunately, neither of the two probing systems described above, allow a user to see an analog representation of the signal under test. Prior logic analyzers solved this problem by including an oscilloscope plug-in module, and allowing a user to connect an oscilloscope probe to the same point at the logic analyzer probe. While this provided the desired view of the analog signal at the same test point, it also increased the loading on the circuit under test.

What is needed is a solution in which both the analog and digital signals may be acquired without causing increased loading on the circuit under test.

SUMMARY OF THE INVENTION

A test and measurement instrument includes a probe providing a single path for conveying signals from a circuit under test to the instrument. A receiver circuit within the instrument divides the path into an analog path and a digital path. The digital path includes a comparator for determining the logic state of signal and producing a digital representation of the signal under test. The analog path includes a multiplexer to selectively couple one of a plurality of analog input signals to an output terminal for viewing on an oscilloscope. One skilled in the art will realize that the digital signal includes both state and timing information at the same time.

In a second embodiment of the invention, the probe head includes a buffer amplifier to reduce loading on the circuit under test and to increase bandwidth of the signals conveyed along the test cable to the instrument.

In yet another embodiment, an electrically trimmable resistor is employed to terminate the transmission line of the test cable in its characteristic impedance in order to reduce reflections and maintain transmission bandwidth.

DETAILED DESCRIPTION OF THE EMBODIMENTS

Figure 1:
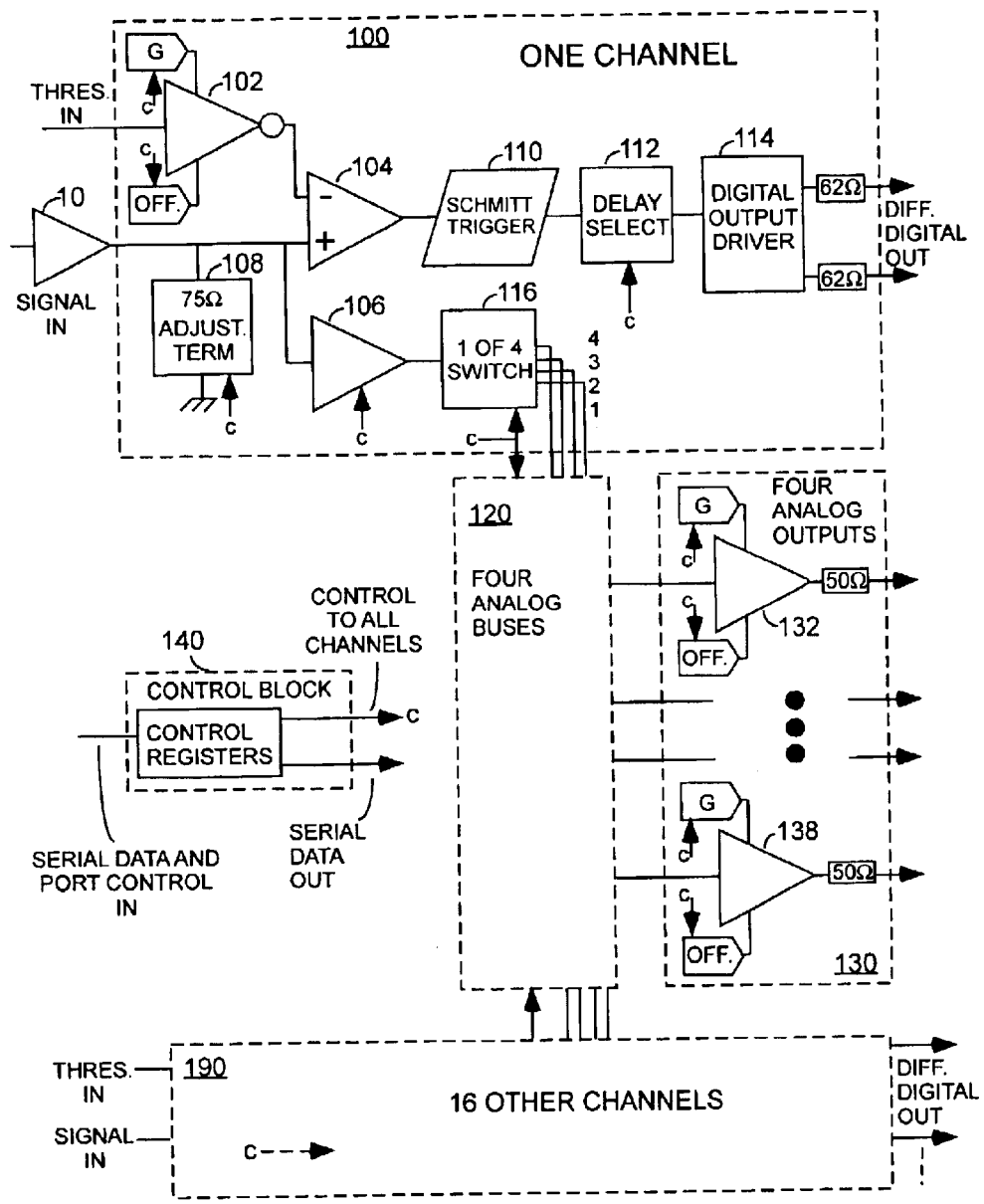
FIG. 1 shows, in block diagram form, a circuit arrangement in accordance with the subject invention.

Referring to FIG. 1, a Probe Receiver integrated circuit (IC), that may be used in a logic analyzer, performs the function of receiving and terminating an analog signal from seventeen channels of an active Probe. The subject IC has, for example, 16 Data Channels and 1 Clock Channel. Each channel comprises a Digital Path 104, 110, 112, 114 and an Analog Path 106, 116, 120 130. At the input of each channel is a variable resistance 75 ohm termination circuit 108, which will be explained in detail with respect to FIGS. 3, 4a, and 4b. The value of the termination can be set with 5 bits of a software-controlled register. A single channel generally designated 100 will be described in detail; the remaining channels, generally designated 190, are substantially identical.

A probe signal from a probe buffer amplifier 10 and a threshold level signal are applied to each Channel's Digital Path. The voltage levels of these two signals must be compared in the Digital Path in order to determine the logic state of the signal. Before these signals are compared, the threshold voltage is adjusted in a Threshold Buffer 102 to be equivalent to the Probe tip voltage. The threshold voltage path's Gain and Offset are each adjusted by software controlled registers G and OFF. to account for differences in each Probe channel. A Comparator stage 104 then compares the adjusted threshold voltage to the Probe voltage. If the Probe voltage is greater than the adjusted threshold voltage, then the output of Comparator 104 goes high. The output signal of Comparator 104 is applied to a Schmitt Trigger 110, and then to a Digital Output Driver 114 via a selectable propagation delay circuit 112. Schmitt Trigger 110 adds hysteresis to the Digital Path, to improve noise rejection when the signal voltage is close to the threshold voltage. The output of the Digital Data Path is differential and reverse terminated in 62 ohms each side. Delay Select 112 provides a means of changing the Digital Path signal propagation delay to aid in Channel to Channel timing match.

The Analog Path in each channel has only the Probe signal applied to it. The Probe signal is applied to a selectable gain Analog Buffer amplifier 106 whose output can drive one of four buses through an Analog Switch 116. The gain of the Buffer Amplifier 106 can be set to 0 (off), 1, 2, 3 by two bits in a software-controlled register of the Control Block of FIG. 1. Switch 116 can be set to select one of four buses using two bits of the software-controlled register. Each of the four buses may be selected by an arrangement of Multiplexers, formed by the combination of switch 116 and four analog buses generally designated 120, to drive an input of an Analog Output Driver. For simplicity, only two of four Analog Output Drivers 132, and 138 are shown. The Gain and Offset for each Analog Output Driver can be adjusted by yet another software controlled register to compensate for Channel to Channel variations. Thus, the combination of all 17 Switches and the four analog buses acts as four 17 to 1 multiplexers.

Each of the 17 channels has a 1 of 4 Switch 116. The output 0 of all 17 Switches are wired in parallel to analog bus 0. The same is true for the other three outputs of the 17

Switches. It is possible for the control registers of more than one Channel to request analog bus 0 be driven simultaneously. This situation is undesirable because signals from a multiple of channels would sum together and overdrive its Analog Output Driver. To prevent this from happening, priority logic circuitry is included in Control Block 140. For example, if an Analog Buffer of Channel 5 is assigned to drive Analog Bus 0, the priority logic determines if any higher priority Channel (1 to 4 in this case) has been assigned to Analog Bus 0. (In this example, priority goes to the lowest channel number.) If one Channel has higher priority, then the priority logic will not allow the Analog Buffer of Channel 5 to drive Analog Bus 0.

Figure 2:
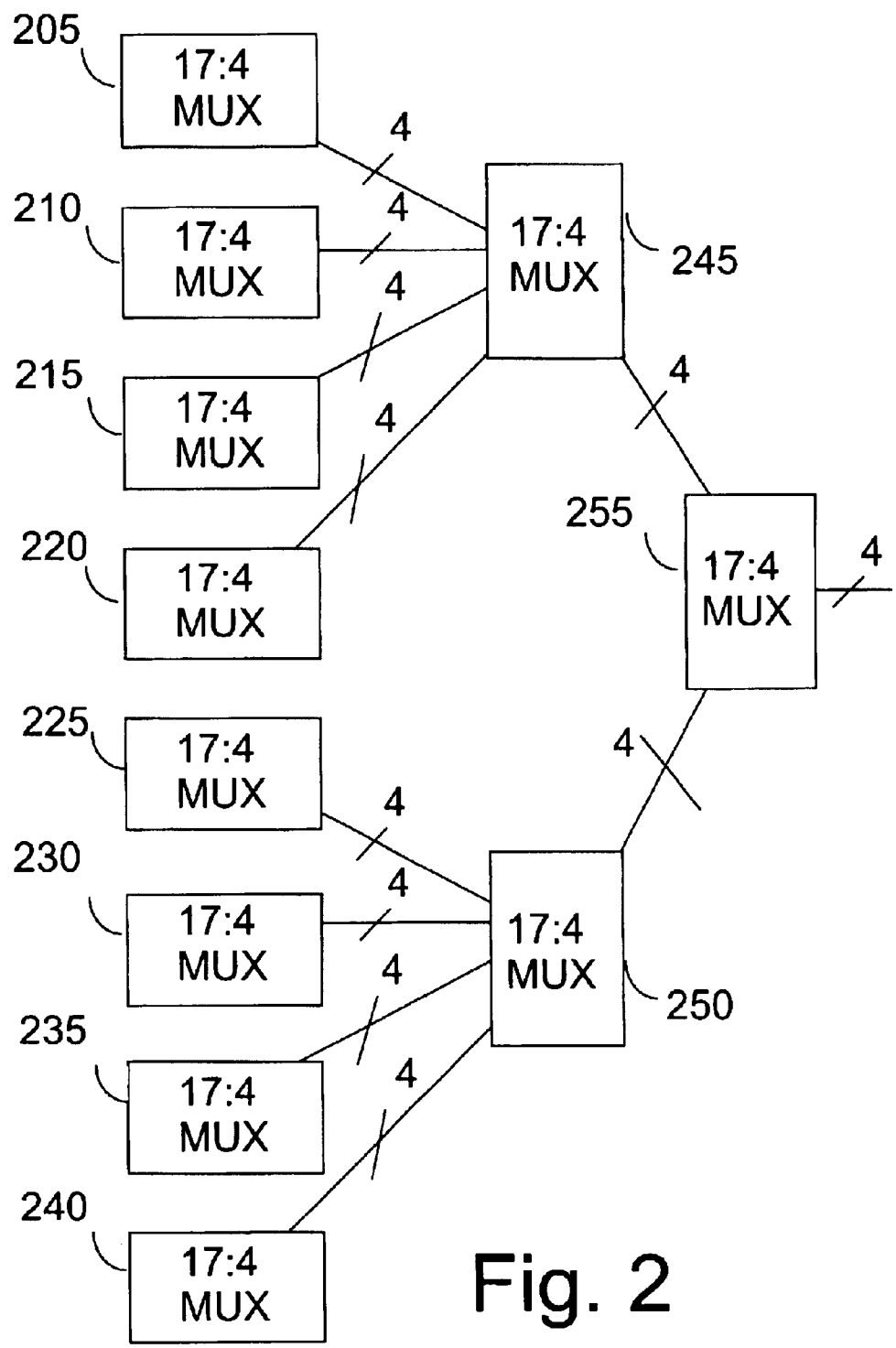
FIG. 2 shows in block diagram form, an analog signal path of an array of circuits according to FIG. 1.

Each of the Analog Output Drivers is single ended and reverse terminated in 50 ohms. It is designed to drive 50 to 75 ohm transmission line, depending on the application of the part. Referring to FIG. 2, it is envisioned that in a particular logic analyzer, up to three of these Receiver ICs Analog Paths may be connected in series. For example, a signal may be selected by Multiplexer 205 for application to Multiplexer 245, and then passed to the output via multiplexer 255. In operation, it is preferable that the Analog Buffer of the first IC is set to a gain of 2 and is terminated into the 75 ohm input impedance of the second IC. Preferably, the Analog Buffer of Second IC is set to a gain of 1 and is terminated into the 75 ohm input impedance of the third IC. Preferably, the Analog Buffer of the Third IC is set to a gain of 1 and is terminated into a 50 ohm impedance of an oscilloscope (not shown).

Figure 3:
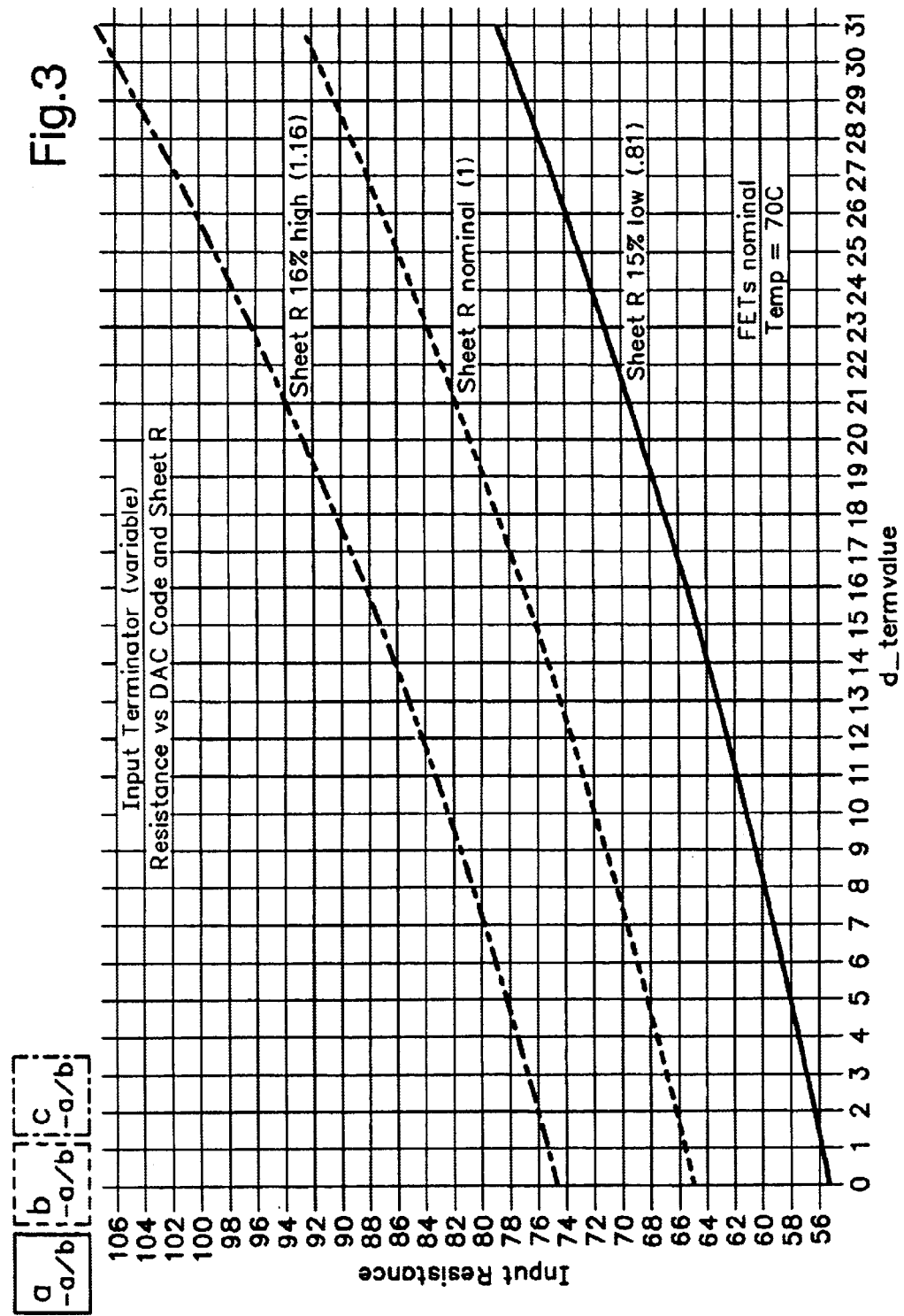
FIG. 3 shows resistance characteristics of an adjustable termination resistor usable in the circuitry of FIG. 1.
Figure 4A:
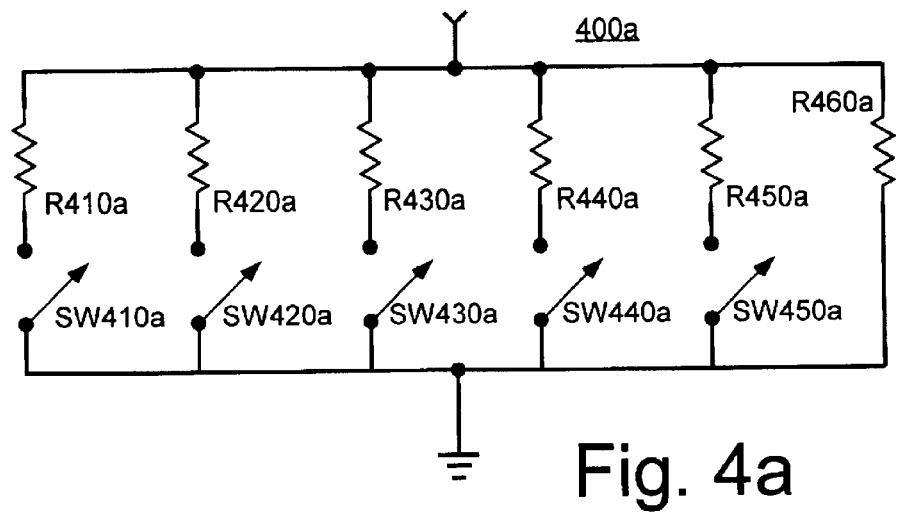
FIGS. 4a and 4b show the details of the adjustable termination resistor of FIG. 1.

Adjustable Termination 108 of FIG. 1 is explained in detail with reference to FIGS. 3, 4a, and 4b. In the simplified form shown in FIG. 4a, Adjustable Termination 108 comprises, for example, six resistors R410a, R420a, R430a, R440a, and R450a that may be selectively connected in parallel with a fixed resistor R460a by operation of switches SW410a, SW420a, SW420a, SW430a, SW440a, and SW450a. When these switches are operated, different combinations of resistors R410a, R420a, R430a, R440a, and R450a are connected from the signal input through closed contacts of the switches to a ground reference point.

Figure 4B:
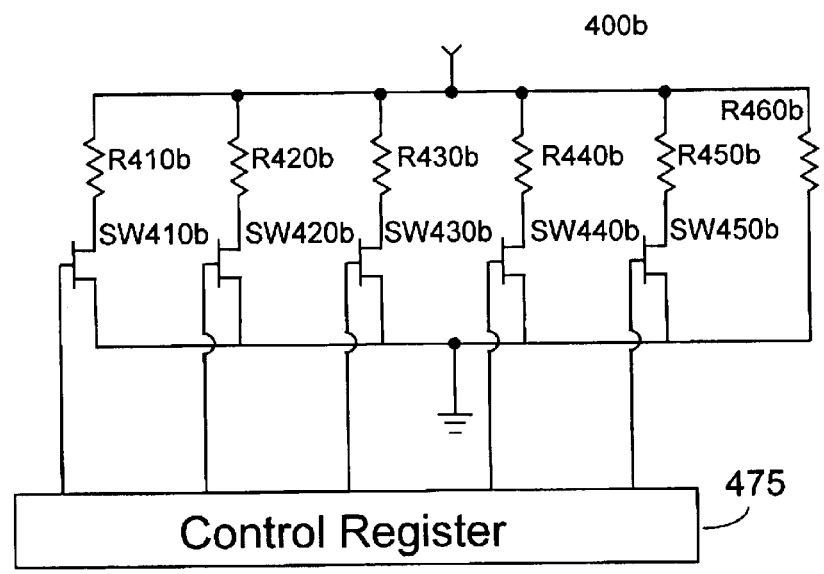

In FIG. 4b, five of the resistors R410b, R420b, R430b, R440b, and R450b have an FET switch connected in series with each of them. The values of the five resistors differ by a binary weighting scheme. By turning on and off different combinations of the FET switches, one can realize 32 different resistance values for the Termination circuit. The range of termination resistor values is fairly large, but due to IC process and temperature variation the guaranteed range is much smaller (~75 +/-1 ohm). The five FET switches SW410b, SW420b, SW420b, SW430b, SW440b, and SW450b are controlled by yet another control register in the Digital Path Control Register. In doing so, the equivalent resistance of the arrangement is made to vary, as can be seen with reference to the graph of FIG. 3. The range of values in this Control Register is 0 to 31, with the highest value giving the highest termination resistance. The resistance range is at least 70 ohms to 80 ohms, but is very process-dependent, and the exact Termination resistor center value and range may not be known by design. Consequently, these values are measured and stored in software tables for each IC, as part of the system calibration cycle.

What has been described is an apparatus that allows both digital and analog signals to be sensed at a common node in a test and measurement, and processed in a separate digital and analog paths. Signal integrity is maintained because the common node and both signal paths are within the same IC.

What is claimed is:

1. A test and measurement instrument, comprising:
    an input conductor for receiving input test signals from a device under test;
    a receiver circuit for conditioning said input test signals from said input conductor;
    a common node wherein said conditioned input test signals are directed in parallel to a digital path and an analog path;
    said digital path for processing said input test signals from said common node to create a digital representation of said input test signals; and
    said analog path for processing said input test signals from said common node to create an analog representation of said input test signals.

2. The test and measurement instrument of claim 1, wherein said input conductor is a probe.

3. The test and measurement instrument of claim 1, wherein said input conductor comprises a buffer amplifier for reducing the loading of said device under test and for increasing the bandwidth of test signals capable of being received by said input conductor.

4. The test and measurement instrument of claim 1, wherein said input conductor comprises a transmission line terminated by an electrically trimmable resistor for reducing reflections and maintaining transmission bandwidth.

5. The test and measurement instrument of claim 1, wherein said receiver circuit comprises a plurality of resistors, wherein at least one of said plurality of resistors has a field effect transistor (FET) switch connected in series, said plurality of resistors and FET(s) forming a termination circuit.

6. The test and measurement instrument of claim 1, wherein said digital path comprises a comparator for determining a logic state of said input test signals and producing a digital representation of said input test signals.

7. The test and measurement instrument of claim 1, wherein said analog path comprises a multiplexer for selectively coupling one of a plurality of analog input signals to an output terminal.

8. The test and measurement instrument of claim 7, wherein said selected analog output signal is coupled to an oscilloscope.

9. A method, comprising:
    receiving, via a common input path, an input test signal from a device under test;
    conditioning said input test signal for processing by a digital path and an analog path;
    directing, at a common node, said conditioned input test signal to said digital path and said analog path;
    processing said input test signal in said digital path to create a digital representation of said input test signal; and
    processing said input test signal in said analog path to create an analog representation of said input test signal.

10. The method of claim 9, wherein said common input path comprises a probe.

11. The method of claim 9, wherein said common input path comprises a buffer amplifier for reducing the loading of said device under test and for increasing the bandwidth of test signals capable of being received via said common input path.

12. The method of claim 9, wherein said common input path comprises a transmission line terminated by an electrically trimmable resistor for reducing reflections and maintaining transmission bandwidth.

13. The method of claim 9, wherein said input conductor is capable of receiving at least one of analog test signals and digital test signals.

* * * * *